United States Patent [19]

Noguchi et al.

[11] Patent Number: 5,419,783
[45] Date of Patent: May 30, 1995

[54] PHOTOVOLTAIC DEVICE AND MANUFACTURING METHOD THEREFOR

[75] Inventors: Shigeru Noguchi; Keiichi Sano; Hiroshi Iwata, all of Osaka, Japan

[73] Assignee: Sanyo Electric Co., Ltd., Osaka, Japan

[21] Appl. No.: 36,455

[22] Filed: Mar. 24, 1993

[30] Foreign Application Priority Data

Mar. 26, 1992 [JP] Japan .................................. 4-068370
Mar. 27, 1992 [JP] Japan .................................. 4-070988
Jun. 16, 1992 [JP] Japan .................................. 4-156694

[51] Int. Cl.$^6$ ..................... H01L 31/075; H01L 31/20
[52] U.S. Cl. ..................................... 136/258; 136/249; 437/4; 437/100; 437/108; 437/109; 257/458
[58] Field of Search .................. 136/258 AM, 249 TJ; 437/4, 100, 108-109; 257/458

[56] References Cited

U.S. PATENT DOCUMENTS

| | | | |
|---|---|---|---|
| 4,968,384 | 11/1990 | Asano | 156/643 |
| 5,066,340 | 11/1991 | Iwamoto et al. | 136/258 |
| 5,248,348 | 9/1993 | Miyachi et al. | 136/258 |

FOREIGN PATENT DOCUMENTS

| | | | |
|---|---|---|---|
| 1-278782 | 11/1989 | Japan | 136/258 AM |
| 2-25078 | 1/1990 | Japan | 136/258 |
| 2-218175 | 8/1990 | Japan | 136/258 |
| 3-52271 | 3/1991 | Japan | 136/258 |
| 3-200374 | 9/1991 | Japan | 136/258 AM |

OTHER PUBLICATIONS

"Structural and Electronic Properties of Silicon-Based Alloys", W. Beyer, *Journal of Non-Crystalline Solids,* 97&98 (1987), North-Holland, Amsterdam, pp. 1027-1034.

"Preparation of Highly Photoconductive Hydrogenated Amorphous Silicon Carbide Films with a Multi-plasma-Zone Apparatus", A. Asano, T. Ichimura and H. Sakai, *J. Appl. Phys.,* 65(6), Mar. 15, 1989, pp. 2439-2444.

"A Study on the Surface Reaction in the Growth of Amorphous Silicon by Intermittent Deposition Method", T. Ishimura, Y. Okayasu, H. Yamamoto, K. Fukuki, *Twentieth IEEE Photovoltaic Specialists Conference-1988,* vol. 1, pp. 114-118.

*Primary Examiner*—Aaron Weisstuch
*Attorney, Agent, or Firm*—Spensley Horn Jubas & Lubitz

[57] ABSTRACT

A photovoltaic device has a transparent substrate, a transparent electrode layer, a photovoltaic layer, and a back electrode which are stacked in this order. The photovoltaic layer has a p-type a-SiC layer provided on the transparent electrode layer, a buffer layer provided on the p-type a-SiC layer, a photosensitive layer provided on the buffer layer, and an n-type semiconductor layer provided on the photosensitive layer. The buffer layer is an a-SiC layer first deposited on the p-type a-SiC layer and then subjected to a plasma treatment. The plasma treatment should be carried out using a gas selected from a group consisting of hydrogen (H$_2$), Argon (Ar), Helium (He), Neon (Ne), Krypton (Kr), and Xenon (Xe). In the device, the buffer layer may be composed of a microcrystalline SiC layer or an amorphous SiC layer. The buffer layer may have a thickness ranging from about 10 Å to about 100 Å, and may be formed by a plasma-CVD process.

8 Claims, 7 Drawing Sheets

PHOTOVOLTAIC DEVICE AND MANUFACTURING METHOD THEREFOR

BACKGROUND OF THE INVENTION

1. Field of the Invention

This invention relates to photovoltaic devices which convert solar energy into electrical energy, and to a method for manufacturing such devices.

2. Description of the Prior Art

Solar energy will increasingly be seen as advantageous from the standpoint of providing environmental safeguards and as compensation for the use of natural resources which cause unacceptable levels of pollution. Photovoltaic devices which directly convert solar energy into electrical energy are attractive because it is easy to invest in the production of solar cells in accordance with the consumption of electric power.

In order to prepare for increasing needs, the photovoltaic devices need improved characteristics, particularly conversion efficiency (an evaluation standard for photovoltaic devices). Improved conversion efficiency will reduce the cost difference between the photovoltaic devices and commercial electrical supplies.

Figure 12:
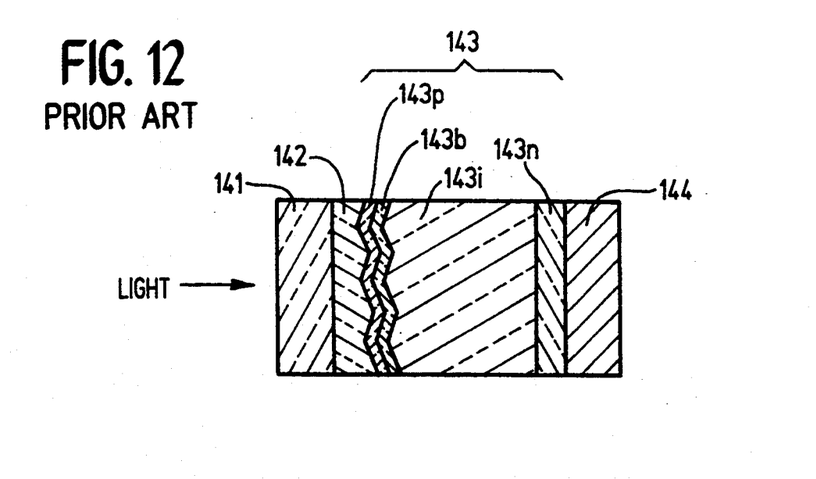
FIG. 12 is a side elevation cross-sectional view of a prior art photovoltaic device.

There are many ways to improve the characteristics of the photovoltaic devices, for example, by developing the photovoltaic device structures and researching superior compositions of materials. FIG.12 shows a cross-sectional illustration of a prior art photovoltaic device which mainly comprises amorphous silicon (hereinafter "a-Si"). In FIG.12, 141 is a transparent insulating substrate made from a material such as plate glass or silica glass. 142 is a transparent conductive electrode layer, comprised of $SnO_2$ or ITO. 143 is a photovoltaic layer including: a) a p-type semiconductor layer 143p, which comprises an amorphous silicon carbide (hereinafter "a-SiC") layer, b) a buffer layer 143b, c) a photosensitive layer 143i comprised of an intrinsic a-Si, and d) an n-type semiconductor layer 143n comprised of an n-type a-Si. 144 is a back electrode composed of aluminum.

There are several ways to improve the conversion efficiency by changing the structure. For example, the buffer layer 143b in the photovoltaic layer 143 may provide improved contacting conditions between the p-type semiconductor layer 143p and the intrinsic semiconductor layer 143i; thus, improvements in the buffer layer 143b can prevent carrier loss due to recombination of charge carriers.

Another way to improve the photovoltaic device is to alter a surface of the transparent conductive electrode layer 142. This surface is usually formed so as to be uneven. Therefore, any light which passes through the transparent substrate is dispersed by the uneven surface, even if the light approaches the surface vertically. The light is bent due to the dispersion, which makes the light path longer. As a result of the longer light path, the probability of the light being absorbed within the photovoltaic layer 143 is increased, and the conversion efficiency may be improved.

In the prior art photovoltaic devices, this characteristic improvement, caused by the uneven surface, is easy to manufacture. On the other hand, improvement of the interface quality to prevent the recombination of charge carriers is not achieved only by the improvement of the quality of the semiconductor layer interface. To improve semiconductor layer quality, it is necessary to perform an adjustment between the semiconductor layers. For consistency between photovoltaic devices, it is necessary to improve the quality of the interfaces between the semiconductor layers.

Another approach is to provide optimum optical bandgaps in the photovoltaic devices. Amorphous semiconductors having large bandgaps and high photo-conductivity are needed. For example, an amorphous semiconductor with a large optical bandgap may be composed of an a-Si layer with carbon (C) or oxygen (O) added to produce a-SiC or a-SiO, a-SiC's and a-SiO's are easy to form by adding methane ($CH_4$) or carbon dioxide ($CO_2$) to silane gas ($SiH_4$) which is the main plasma CVD reaction gas for producing a silicon semiconductor layer. This plasma-CVD method is the same method used to form an a-Si layer, which substantially comprises the main structure in the photovoltaic devices. Therefore, the method has an advantage of allowing continuous formation of succeeding layers of a-Si and a-SiC (or a-SiO) during the manufacturing of the photovoltaic devices.

A method of forming amorphous semiconductor layer including carbon (C) or oxygen (O), is described in *Journal of Non-Crystalline Solids* 97 & 98 (1987), p 1027–1034, which can increase the optical bandgap. However, this method causes a reduction in the photo-conductivity, and thus, it is difficult to obtain superior photovoltaic characteristics.

Another method of increasing the optical bandgap is by increasing the hydrogen concentration in the amorphous semiconductors. For the a-Si layers formed by plasma decomposition of silane gas ($SiH_4$), hydrogen is incorporated in the a-Si layers at a high degree. Therefore, this method can widen the optical bandgap. This method may be easily performed by reducing the substrate temperature during the manufacture of amorphous semiconductors.

On the other hand, increasing the optical bandgap by incorporating large amounts of hydrogen causes a reduction in the quality of the semiconductor. This is due to the reduced substrate temperature during manufacture, which makes it difficult to obtain high photo-conductivity characteristics in the photovoltaic devices.

SUMMARY OF THE INVENTION

Accordingly, to obviate the above mentioned limitations, it is a primary object of the present invention to provide a photovoltaic device with a high conversion efficiency.

Another object of present invention is to provide a photovoltaic device with superior photo-conductivity.

Still another object of the present invention is to provide a photovoltaic device with a large optical bandgap.

Yet another object of the present invention is to provide a photovoltaic device having a buffer layer having low resistance.

Further objects of the present invention are to provide a photovoltaic device having a plurality of photovoltaic layers having superior electrical characteristics.

The above objects may be fulfilled by an embodiment of the invention wherein a photovoltaic device comprises a transparent substrate, a transparent electrode layer being provided on the transparent substrate, a photovoltaic layer being provided on the transparent electrode, and a back electrode being provided on the photovoltaic layer. The photovoltaic layer includes a p-type a-SiC layer provided on the transparent electrode layer, a buffer layer disposed on the p-type a-SiC layer, a photosensitive layer disposed on the buffer layer and an n-type semiconductor layer disposed on the photosensitive layer. The layers are arranged such that the buffer layer is an a-SiC layer first deposited on the p-type a-SiC layer and then subjected to a plasma treatment.

The above objects may also be fulfilled by an embodiment of the invention wherein a photovoltaic device comprises an opaque substrate, a photovoltaic layer being provided on the opaque substrate, and a transparent electrode being provided on the photovoltaic layer. The photovoltaic layer includes a p-type a-SiC layer provided on the transparent electrode, a buffer layer disposed on the p-type a-SiC layer, a photosensitive layer disposed on the buffer layer, and an n-type semiconductor layer disposed between the photosensitive layer and the opaque substrate. The layers are arranged such that the buffer layer is an a-SiC layer first deposited on the photosensitive layer and then subjected to a plasma treatment.

The plasma treatment may be carried out using a gas selected from a group consisting of hydrogen gas ($H_2$), Argon (Ar), Helium (He), Neon (Ne), Krypton (Kr) and Xenon (Xe). The buffer layer may be composed of a microcrystalline SiC layer or an a-SiC layer, with the thickness ranging from about 10 Å to about 100 Å and may be formed by a plasma-CVD method.

The above objects may be further fulfilled by an embodiment of the invention wherein a photovoltaic device comprises a transparent substrate, a transparent electrode layer being provided on the transparent substrate, a photovoltaic layer being provided on the transparent electrode and a back electrode being provided on the photovoltaic layer. The photovoltaic layer includes a p-type a-SiC layer provided on the transparent electrode layer, a buffer layer disposed on the p-type a-SiC layer, a photosensitive layer disposed on the buffer layer and an n-type semiconductor layer disposed on the photosensitive layer. The layers are arranged such that the buffer layer is a microcrystalline SiC layer first deposited on the p-type a-SiC layer and then subjected to a plasma treatment using hydrogen gas.

The above objects may also be fulfilled by another embodiment of the invention wherein a photovoltaic device comprises an opaque substrate, a photovoltaic layer being provided on the opaque substrate, and a transparent electrode being provided on the photovoltaic layer. The photovoltaic layer includes a p-type a-SiC layer provided on the transparent electrode, a buffer layer disposed on the p-type a-SiC layer, a photosensitive layer disposed on the buffer layer, and an n-type semiconductor layer disposed between the photosensitive layer and the opaque substrate. The layers are arranged such that the buffer layer is a microcrystalline SiC layer first deposited on the photosensitive layer and then subjected to a plasma treatment using hydrogen gas.

The buffer layer may have a thickness ranging from about 25 Å to about 300 Å, with the thickness preferably ranging from about 50 Å to about 150 Å.

The above objects may be fulfilled by a method for manufacturing a photovoltaic device comprising the steps of preparing a transparent substrate, depositing a transparent conductive layer on the transparent substrate, then forming a first conductivity type a-SiC layer in contact with the transparent conductive layer. Next, an a-SiC layer is formed by a plasma-CVD method on the first conductivity type a-SiC layer, and the a-SiC layer is subjected to a plasma treatment to thereby form a buffer layer. Following this, an intrinsic a-SiC layer is formed on the buffer layer to obtain a photosensitive layer, then a second conductivity type a-SiC layer is formed on the photosensitive layer, and then contacted with a back electrode.

The above objects are also fulfilled by a method of manufacturing a photovoltaic device comprising the steps of preparing an opaque substrate, and forming a first conductivity type a-SiC layer in contact with the opaque substrate. Next, an intrinsic a-SiC layer is formed on the first conductivity type a-SiC layer to obtain a photosensitive layer. Following this, an a-SiC layer is formed by a plasma-CVD method on the photosensitive layer, and then the a-SiC layer is treated to a plasma treatment to thereby form a buffer layer. Lastly, a second conductivity type a-SiC layer is formed on the buffer layer and then a transparent electrode is formed, as a contact, onto the second conductivity type a-SiC layer.

The above objects may be further fulfilled by a method for manufacturing a photovoltaic device comprising the steps of preparing a transparent substrate, and then depositing a transparent conductive layer on the transparent substrate. Next, a first conductivity type a-SiC layer is formed in contact with the transparent conductive layer, then an a-SiC layer is formed by a plasma-CVD method on the first conductivity type a-SiC layer, and then subjecting the a-SiC layer to a plasma treatment to thereby form a buffer layer composed of a microcrystalline SiC layer. Following this, an intrinsic a-SiC layer is formed on the buffer layer to define a photosensitive layer, then a second conductivity type a-SiC layer is formed on the photosensitive layer, and then a back electrode is formed as a contact to the second conductivity type a-SiC layer.

In the above described methods, the plasma treatment may be carried out using a gas selected from a group consisting of hydrogen ($H_2$) and an inert gas, such as Argon (Ar), Helium (He), Neon (Ne), Krypton (Kr) and Xenon (Xe). The buffer layer may have a thickness ranging from about 10 Å to about 100 Å.

The above objects may be fulfilled by yet another method for manufacturing a photovoltaic device comprising the steps of preparing an opaque substrate, then forming a first conductivity type a-SiC layer in contact with the opaque substrate, and then forming an intrinsic a-SiC layer on the first conductivity type a-SiC layer to define a photosensitive layer. Next, an a-SiC layer is formed by a plasma-CVD method on the photosensitive layer, and then the a-SiC layer is subjected to a plasma treatment to thereby form a buffer layer composed of a microcrystalline SiC layer. Following this, a second conductivity type a-SiC layer is formed on the buffer layer, and then a transparent electrode is formed as a contact to the second conductivity type a-SiC layer.

The buffer layer may have a thickness ranging from about 25 Å to about 300 Å, with the thickness preferably ranging from about 50 Å to about 150 Å.

The above objects may be fulfilled by yet another embodiment of a photovoltaic device having a transparent substrate, a plurality of photovoltaic layers provided on the transparent substrate and a back electrode disposed on the plurality of photovoltaic layers. In this embodiment, one of the plurality of photovoltaic layers is composed of a first conductivity type amorphous semiconductor layer in contact with the transparent substrate, an intrinsic amorphous semiconductor layer provided on the first conductivity type amorphous semiconductor layer, and a second conductivity type amorphous semiconductor layer provided on the intrinsic amorphous semiconductor layer. The intrinsic amorphous semiconductor layer is composed of an a-SiC layer and has a thickness of about 1000Å. The a-SiC layer is formed on the first conductivity type amorphous semiconductor layer by a plasma-CVD method and then subjected to a plasma-treatment using a gas selected from one of a hydrogen gas and an inert gas, wherein the plasma-CVD method and the plasma treatment is performed in multiple cycles, each cycle forming an intrinsic layer of about 100 Å to achieve an a-SiC layer of thickness less than about 1000 Å.

The above objects may also be fulfilled by another embodiment of a photovoltaic device having an opaque substrate, a plurality of photovoltaic layers provided on the opaque substrate and a transparent electrode disposed on the plurality of photovoltaic layers. In this embodiment, one of the plurality of photovoltaic layers is composed of a first conductivity type amorphous semiconductor layer in contact with the transparent electrode, an intrinsic amorphous semiconductor layer being provided on the first conductivity type amorphous semiconductor layer, and a second conductivity type amorphous semiconductor layer provided on the intrinsic amorphous semiconductor layer. The intrinsic amorphous semiconductor layer is composed of an a-SiC layer and has a thickness of about 1000Å. The a-SiC layer is formed on the first conductivity type amorphous semiconductor layer by a plasma-CVD method, and then treated by a plasma-treatment using a gas selected from one of a hydrogen gas and an inert gas, wherein the plasma-CVD method and plasma treatment is performed in multiple cycles, each cycle forming an intrinsic layer of about 100 A to achieve an a-SiC layer of thickness less than about 1000 A.

In the devices described above, the inert gas may be selected from a group consisting of Argon (Ar), Helium (He), Neon (Ne), Krypton (Kr), and Xenon (Xe).

The above objects may be fulfilled by yet another method for manufacturing a photovoltaic device comprising the steps of preparing a transparent substrate, then depositing a transparent conductive layer on the transparent substrate, and then forming a first conductivity type amorphous semiconductor on the transparent conductive layer. Next, an intrinsic amorphous semiconductor layer is formed on the first conductivity type amorphous semiconductor layer, where the intrinsic amorphous semiconductor layer is composed of a-SiC formed by a plasma-CVD method and having a thickness of about 1000 Å. Following this, the intrinsic amorphous semiconductor layer is subjected to a plasma-treatment using a gas chosen from hydrogen gas and an inert gas, wherein the plasma-CVD method and plasma treatment is performed in multiple cycles, each cycle forming an intrinsic layer of about 100 Å to achieve an a-SiC layer of thickness less than about 1000 Å. The next step involves forming a second conductivity type amorphous semiconductor layer on the intrinsic amorphous semiconductor layer, then forming at least one photovoltaic layer on the second conductivity type amorphous semiconductor layer, and then providing a back electrode on the at least one photovoltaic layer.

The above objects may also be fulfilled by still another method of manufacturing a photovoltaic device comprising the steps of preparing an opaque substrate, then forming at least one photovoltaic layer on the opaque substrate, and then forming a first conductivity type amorphous semiconductor layer on the at least one photovoltaic layer. Next, an intrinsic amorphous semiconductor layer is formed on the first conductivity type amorphous semiconductor layer, the intrinsic amorphous semiconductor layer being composed of a-SiC formed by a plasma-CVD method and having a thickness of about 1000 Å. Following this, the intrinsic amorphous semiconductor layer is subjected to a plasma treatment using a gas chosen from hydrogen gas and an inert gas, wherein the plasma-CVD method and plasma treatment is performed in multiple cycles, each cycle forming an intrinsic layer of about 100 Å to achieve an a-SiC layer of thickness less than about 1000 Å. The next step involves forming a second conductivity type amorphous semiconductor layer on the intrinsic amorphous semiconductor layer and then providing a transparent conductive electrode on the second conductivity type amorphous semiconductor layers.

In the methods described above, the inert gas may be selected from a group of Argon (Ar), Helium (He), Neon (Ne), Krypton (Kr), and Xenon (Xe).

BRIEF DESCRIPTION OF THE DRAWINGS

These and other objects, advantages, and features of the invention will become apparent from the following description thereof taken in conjunction with the accompanying drawings which illustrate specific embodiments of the invention. In the drawings.

DETAILED DESCRIPTION OF THE PREFERRED EMBODIMENT

The following detailed description is of the best presently contemplated mode of carrying out the invention. This description is not to be taken in a limiting sense, but is made merely for the purpose of illustrating general principles of embodiments of the invention. The scope of the invention is defined by the appended claims.

In the first and second embodiments of the present invention, the buffer layer is made of an a-SiC layer formed between the p-type a-SiC layer and the photosensitive layer in the photovoltaic layer. The buffer layer is treated so that the resistivity of the buffer layer decreases. This improves the fill factor of the photovoltaic device and results in improved conversion efficiency.

In the following embodiment of the present invention, "the microcrystalline SiC layer" can be a composition from one of the following three types: First, the microcrystalline SiC layer may be made of an a-SiC layer including microcrystalline SiC (hereafter, "F mc-SiC"). Second, the microcrystalline SiC layer may be made of an a-SiC layer including microcrystalline SiC of a stoichiometric ratio (hereafter, "S mc-SiC"). Third, the microcrystalline SiC layer may be made of microcrystalline SiC doped by carbon (C) (hereafter, "T mc-SiC").

The above three types of microcrystalline SiC layers are a key advantage of the present invention.

FIRST EMBODIMENT

Figure 1:
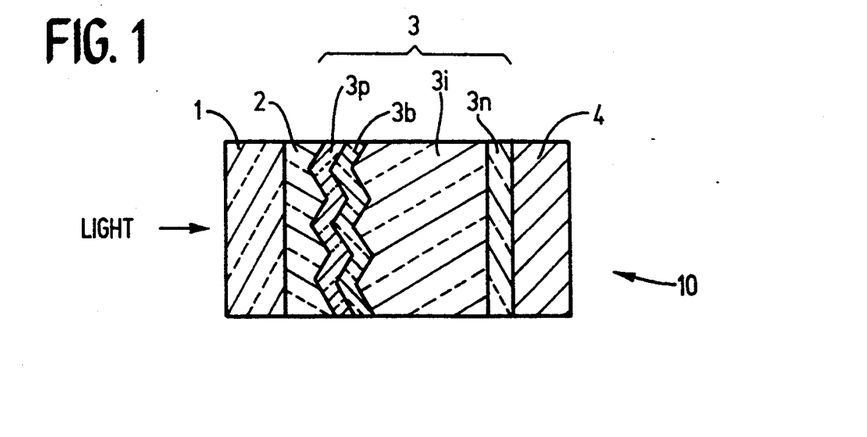
FIG. 1 is a side elevation cross-sectional view of a photovoltaic device in accordance with a first embodiment present invention.

FIG. 1 shows a side elevation cross-sectional view of a photovoltaic device 10 in accordance with a first embodiment of the present invention. The photovoltaic device 10 is formed by a transparent insulated substrate 1 made of materials such as glass plate. A transparent conductive electrode layer 2 is made of materials such as ITO, tin oxide, indium oxide or the like, which forms one electrode terminal of the photovoltaic device. A photovoltaic layer 3 is comprised of a p-type semiconductor layer 3p made of a-SiC and a buffer layer 3b composed of microcrystalline SiC with a thickness of approximately 25 Å to approximately 300 Å. The photovoltaic layer 3 also includes a photosensitive layer 3i composed of intrinsic a-Si, and an n-type semiconductor layer 3n composed of a-SiC. Attached to the photovoltaic layer 3 is a back electrode 4 made of material such as aluminum, which forms another electrode terminal of the photovoltaic device 10. In this device 10, a preferred thickness of the buffer layer 3b ranges from approximately 50 Å to approximately 150 Å.

The typical conditions for formation of the p-type semiconductor layer 3p, the photosensitive layer 3i, and the n-type semiconductor layer 3n are shown in table 1. In table 1, "A" represents the amount of gas (sccm) used in formation, "B" represents the RF power (W) needed, "C" represents the substrate temperature (C) during formation, "D" represents the reaction pressure (Pa) during formation, and "E" represents the resulting thickness of the layer (A)

TABLE 1

| | A | B | C | D | E |
|---|---|---|---|---|---|
| p-layer | $SiH_4$: 10 sccm | | | | |
| | $CH_4$: 20 sccm | 20 W | 200° C. | 8 Pa | 100 Å |

TABLE 1-continued

| | A | B | C | D | E |
|---|---|---|---|---|---|
| | $B_2H_6$: 0.01 sccm | | | | |
| i-layer | $SiH_4$: 50 sccm | 5 W | 200° C. | 13 Pa | 5000 Å |
| n-layer | $SiH_4$: 10 sccm | 10 W | 200° C. | 3 Pa | 500 Å |

To form the buffer layer 3b, an a-SiC layer which does not include microcrystalline SiC is first deposited. The a-SiC layer is subjected to a plasma-treatment using hydrogen to obtain the microcrystalline SiC structure in the a-SiC layer. Thus, after forming the p-type semiconductor layer (3p) on the transparent conductive electrode layer 2, an a-SiC layer is formed on the p-type semiconductor layer 3p. The surface of the a-SiC layer is then plasma treated using hydrogen, with the result being an entirely micro-crystallized a-SiC layer.

Typical conditions for formation of the a-SiC layer before the plasma treatment using hydrogen are shown in table 2. Table 3 shows typical conditions for the three types of layers used in the plasma treatment.

TABLE 2

| Typical conditions | F mc-SiC | S mc-SiC | T mc-SiC |
|---|---|---|---|
| $SiH_4$ (sccm) | 10 | 10 | 10 |
| $CH_4$ (sccm) | 2–10 | 5–20 | 5–20 |
| $H_2$ (sccm) | 0–700 | 0–700 | 0–700 |
| Substrate Temperature (°C.) | 200 | 200 | 200 |
| RF power (W) | 20 | 20 | 20 |
| Pressure (Pa) | 10–50 | 10–50 | 10–50 |

TABLE 3

| Typical conditions | F mc-SiC | S mc-SiC | T mc-SiC |
|---|---|---|---|
| $H_2$ (sccm) | 200 | 200 | 200 |
| $CH_4$ (sccm) | — | 5–100 | — |
| Substrate Temperature (°C.) | 200 | 200 | 200 |
| RF power (W) | 20 | 20–50 | 20–30 |
| Pressure (Pa) | 30 | 30–40 | 30 |

Figure 2:
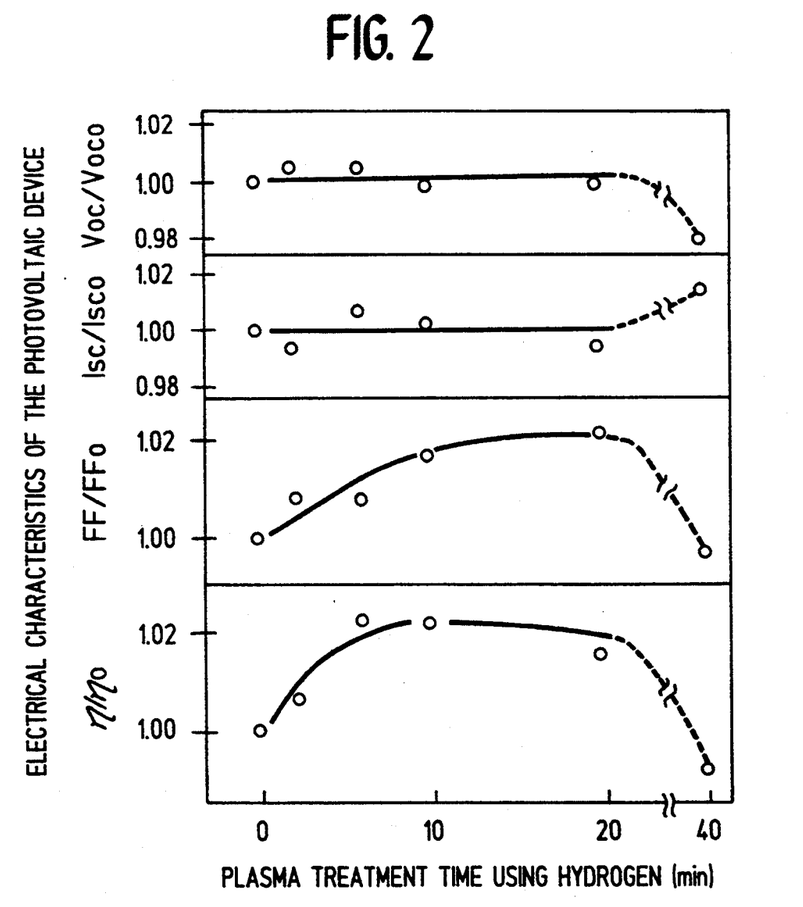
FIG. 2 is a graph showing the relationship between plasma treatment time using hydrogen and electrical characteristics of the photovoltaic device in accordance with an embodiment of the present invention.

The electrical characteristics of the photovoltaic device of the first embodiment are described below. FIG. 2 shows the relationship between the plasma treatment time using hydrogen and the electrical characteristics of the photovoltaic device. According to the relationship between the plasma treatment time and the micro-crystallization, the longer the photovoltaic device is plasma treated the greater the likelihood of sufficient microcrystallization in the mc-SiC layer. In FIG. 2, the vertical axis represents ratios of the results obtained for the photovoltaic device in this embodiment, compared to a photovoltaic device without the plasma treatment. The ratios include the open-circuit voltage (Voco), the short-circuit current (Isco), the fill factor (FFo) and the conversion efficiency ($\eta o$). A ratio larger than 1 shows the advantage of the plasma treatment using hydrogen. The microcrystalline SiC layer used in FIG. 2 is a "T mc-SiC" layer having a thickness of about 100 Å.

According to FIG. 2, for a plasma treatment of 20 minutes duration, there is no change in the open-circuit voltage (Voco) and the short-circuit current (Isc) ratios. On the other hand, after a 15 minutes plasma treatment the fill factor (F.F.) rapidly improves to a fill factor ratio of 1.02. As a result of this improvement, the conversion efficiency ($\eta$) also increases to 1.02.

A plasma treatment for over 20 minutes causes deterioration of the electrical characteristics of the photovoltaic device, with the exception of the short-circuit current. The reason for this deterioration is because the plasma treatment using hydrogen accelerates the micro-crystallization of the a-SiC, and therefore, the number of the micro-crystalline grains is increased, and the resistivity of the mc-SiC layer is decreased. However, this results in an increase in the amount of charge carrier recombination, and thus the characteristics of the photovoltaic device are deteriorated.

As for the micro-crystalline grains, after the plasma treatment using hydrogen, grains are observed in the mc-SiC layer when viewed under a microscope. As a result of this observation, it is concluded that using the mc-SiC layer as the buffer layer after forming the a-SiC causes a reduction in the recombination of the carriers, and therefore, photon energy can be converted into electrical energy for external use.

Formation of the mc-SiC layer with the plasma treatment using hydrogen may be easily carried out by controlling the duration of the plasma treatment.

SECOND EMBODIMENT

The structure of the photovoltaic device is not limited to the first embodiment of the present invention. Instead of using the incident light passing through the substrate, this structure uses incident light passing through a front surface electrode on the side opposite the substrate.

Figure 3:
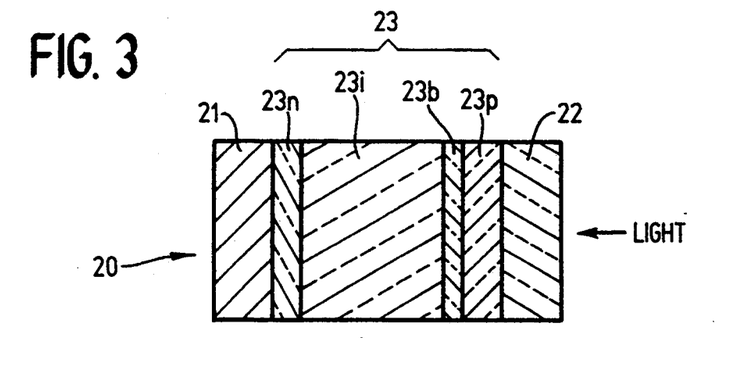
FIG. 3 is a side elevation cross-sectional view of a photovoltaic device in accordance with a second embodiment of the present invention.

The structure of the photovoltaic device 20 in accordance with the present invention is shown in FIG. 3. The photovoltaic device 20 in FIG. 3 has an opaque (non-transparent) substrate 21 made of a stainless plate, and a transparent conductive electrode layer 22. The substrate 21 and the electrode layer 22 have a different structure as compared to the first embodiment. The photovoltaic device also has a photovoltaic layer 23 comprising a p-type a-SiC layer 23p, a buffer layer 23b, a photosensitive layer 23i, and an n-type semiconductor layer 23n. The n-type semiconductor layer 23n is formed on the substrate 21 by ordinary manufacturing methods, such as chemical vapor deposition (CVD). The photosensitive layer 23i is formed on the n-type semiconductor layer 23n, and is composed of intrinsic a-Si. The a-SiC buffer layer 23b is formed by the plasma-CVD on the photosensitive layer 23i, and then the surface of the a-SiC layer is subjected to the plasma treatment using hydrogen in order to obtain the mc-SiC layer to complete formation of the buffer layer 23b. After this, a p-type a-SiC layer 23p is formed on the buffer layer 23b with a transparent electrode layer 22 next being formed in contact with the p-type a-SiC layer 23p. Typical conditions for forming the above layers are almost the same as that of the first embodiment described above.

In the second embodiment, the photovoltaic device 20 in FIG. 3 has excellent electrical characteristics, such as improved control over the recombination of the charge carriers.

THIRD EMBODIMENT

In third and fourth embodiments (described below), the photovoltaic devices have an a-SiC layer with less than approximately 100 Å thickness and which is subjected to plasma treatment using hydrogen gas or inert gas.

As a result, the optical bandgap of the photovoltaic layer can be increased while maintaining high photo-conductivity. The result may be obtained from a single plasma treatment, and may also be expected by repeatedly forming the layer which is subjected to the plasma treatment.

In the third embodiment, hydrogen gas or inert gas is used in the plasma treatment because the treatment using hydrogen gas increases the amount of the hydrogen in the layers, which results in them being activated. The treatment using inert gas, such as Argon (Ar), Helium (He), Neon (Ne), Krypton (Kr), or Xenon (Xe), also causes activation of the layers. Therefore, treatment using hydrogen gas or an inert gas results in an improvement in the electrical characteristics of the photovoltaic device of the third embodiment.

The structure of the photovoltaic devices in accordance with the third embodiment of the present invention may prevent the loss of incident light due to the above described treatments. Further, the recombination of the charge carriers may be controlled with this structure. Therefore, the photoelectric energy generated in the photovoltaic layer may be more effectively produced.

Figure 4:
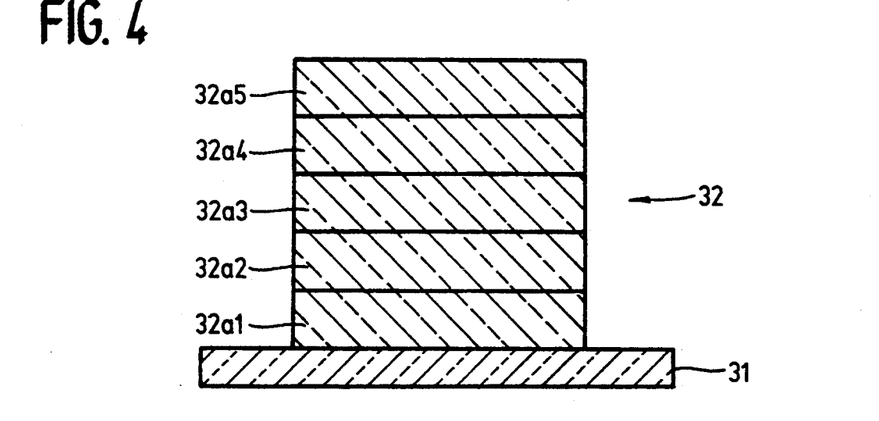
FIG. 4 is a side elevation cross-sectional view of a portion of a photovoltaic device in accordance with a third embodiment of the present invention.

FIG. 4 shows a cross-sectional view of a photovoltaic device with an a-SiC layer according to the third embodiment of the present invention. Substrate 31 is composed of plate glass. A film of a-SiC 32a1 is formed on the substrate 31, followed by four other a-SiC films 32a2, 32a3, 32a4, and 32a5 formed in a stacked fashion to obtain a-SiC layer 32. To form the a-SiC layer 32, the a-SiC 32a1 film is deposited with a thickness of less than approximately 100 Å by plasma-CVD. Preferably, the a-SiC film 32a1 has a thickness of approximately 50 Å. Typical formation conditions for maintaining high photo-conductivity of the a-SiC film 32a1 are shown in table 4.

TABLE 4

| Typical conditions | |
|---|---|
| SiH4 (sccm) | 10 |
| CH4 (sccm) | 5-15 |
| H2 (sccm) | 0-700 |
| Substrate Temperature (°C.) | 80-250 |
| RF power (W) | 3-30 |
| Pressure (Pa) | 0.1-0.5 |

Once the a-SiC film 32a1 is formed it is subjected to the plasma treatment using hydrogen gas. As discussed with respect to the other embodiments, inert gas, such as Argon (Ar), Helium (He), Neon (Ne), Krypton (Kr), or Xenon (Xe) can be used instead of hydrogen gas. Typical conditions for the plasma treatment are shown in table 5. Plasma treatment may cause an improvement in the photo-conductivity or the optical bandgap of the a-SiC film 32a. In the table 5, hydrogen gas or inert gas, such as Argon (Ar), Helium (He), Neon (Ne) Krypton (Kr), or Xenon (Xe) may be used for the treatment.

TABLE 5

| Typical conditions | |
|---|---|
| Substrate Temperature (°C.) | 80-250 |
| RF power (W) | 3-30 |
| Degree of vacuum (Torr) | 0.05-0.15 |
| Gas amount (sccm) | 50 |

On the a-SiC film 32a1, an a-SiC film 32a2 is formed with a thickness of less than approximately 100 Å by plasma-CVD and the film is then subjected to the plasma treatment. The forming and treating sequences are repeated four times to create the a-SiC layer 32, which is composed of five a-SiC films 32a1, 32a2, 32a3, 32a4, and 32a5.

Figure 5:
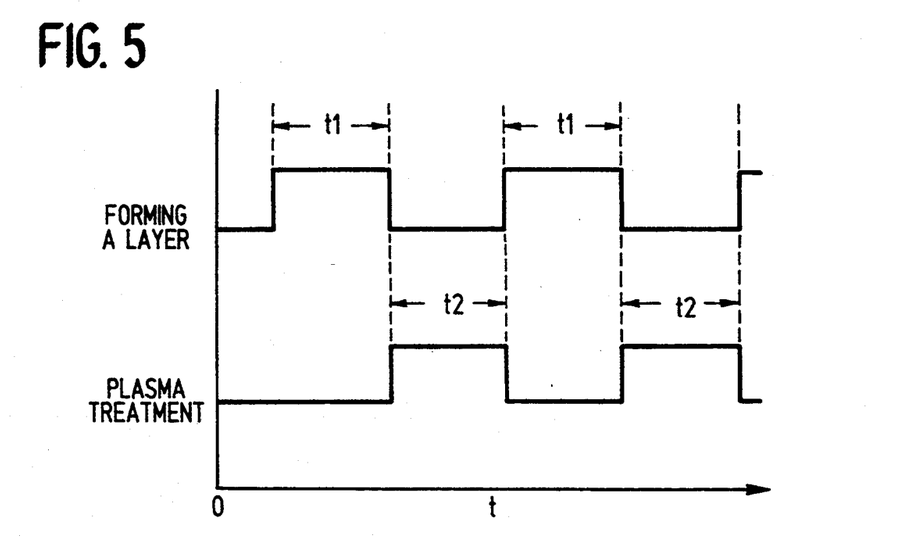
FIG. 5 is a graph showing the relationship between plasma treatment time and layer forming time in accordance with the third embodiment, shown in FIG. 4.

FIG. 5 shows the time chart relationship between plasma treatment time (t1) and film forming time (t2). According to FIG. 5, the a-SiC films 32a1, 32a2 etc. can be formed during a continuous series of forming times (t1) to form the a-SiC film 32an (n=1, 2, 3, 4, 5, etc) followed by a plasma treatment time (t2).

In accordance with the above treatments, the thin a-SiC films 32a1–32a5 have thicknesses less than approximately 100 Å. This maintains high photo-conductivity of the a-SiC layer 32 and yields an increased optical bandgap for the a-SiC layer 32 after the completion of all treatments.

Figure 6:
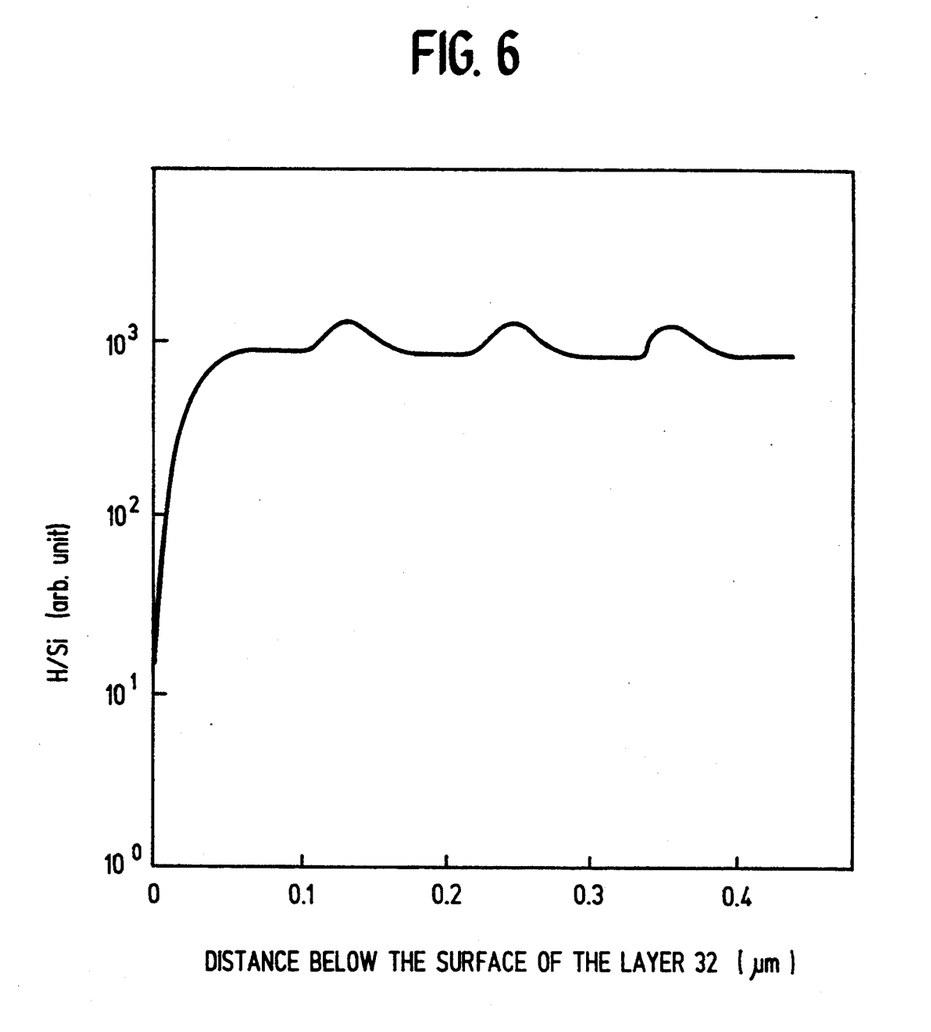
FIG. 6 is a graph showing the relationship between thickness of the layer and the ratio of hydrogen to silicon in accordance with the third embodiment, shown in FIG. 4.

FIG. 6 shows the relationship between depth below the surface of the layer 32 and a secondary ion mass analysis of the ratio of hydrogen to silicon. In FIG. 6, the abscissa represents depth below the surface of the a-SiC layer 32, and the ordinate represents the ratio of hydrogen to silicon. For example, a value of "0" on the abscissa corresponds to the surface of the a-SiC layer 32. FIG. 6 represents results from the surface of the a-SiC layer 32 down to the third a-SiC film 32a3.

As shown in FIG. 6, there are periodic regions below the surface of the a-SiC layer 32 where the amount of hydrogen increases.

Figure 7:
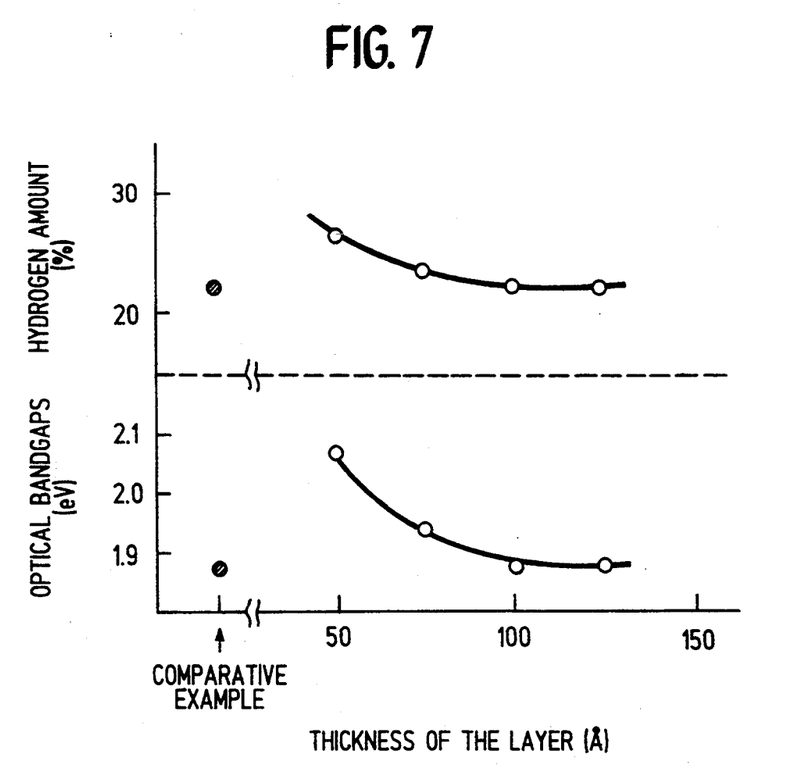
FIG. 7 is a graph showing the relationship between thickness of the layer and both hydrogen percentage and the optical bandgaps in accordance with the third embodiment, shown in FIG. 4.

FIG. 7 shows the relationship between a-SiC film thickness and percent hydrogen and the corresponding optical bandgap that is measured. The duration of the plasma treatment is set at a fixed value of two minutes before measurements are made. FIG. 7 also shows a comparative result (solid dot) for a prior art a-SiC layer, which is not subjected to the plasma treatment using hydrogen and is formed as only a single a-SiC layer. According to FIG. 7, setting the thickness of the a-SiC film to more than approximately 100 Å results in only minor optical band differences from those observed in the prior art photovoltaic device.

It has been found that the a-SiC film should have a thickness less than 100 Å. Preferably the thickness of the a-SiC film should range from about 10 Å to about 100 Å. Below a thickness of approximately 10 Å, the film does not have sufficient structure for a device and therefore, many layers are required to form the device. On the other hand, thicknesses of more than about 100 Å require a long formation time for the film in order to obtain adequate results with the plasma treatment using hydrogen gas or inert gas. Thus, thicknesses more than 100 Å are not suitable for manufacturing devices, and furthermore, the advantages of the plasma treatment cannot be not fully achieved.

Figure 8:
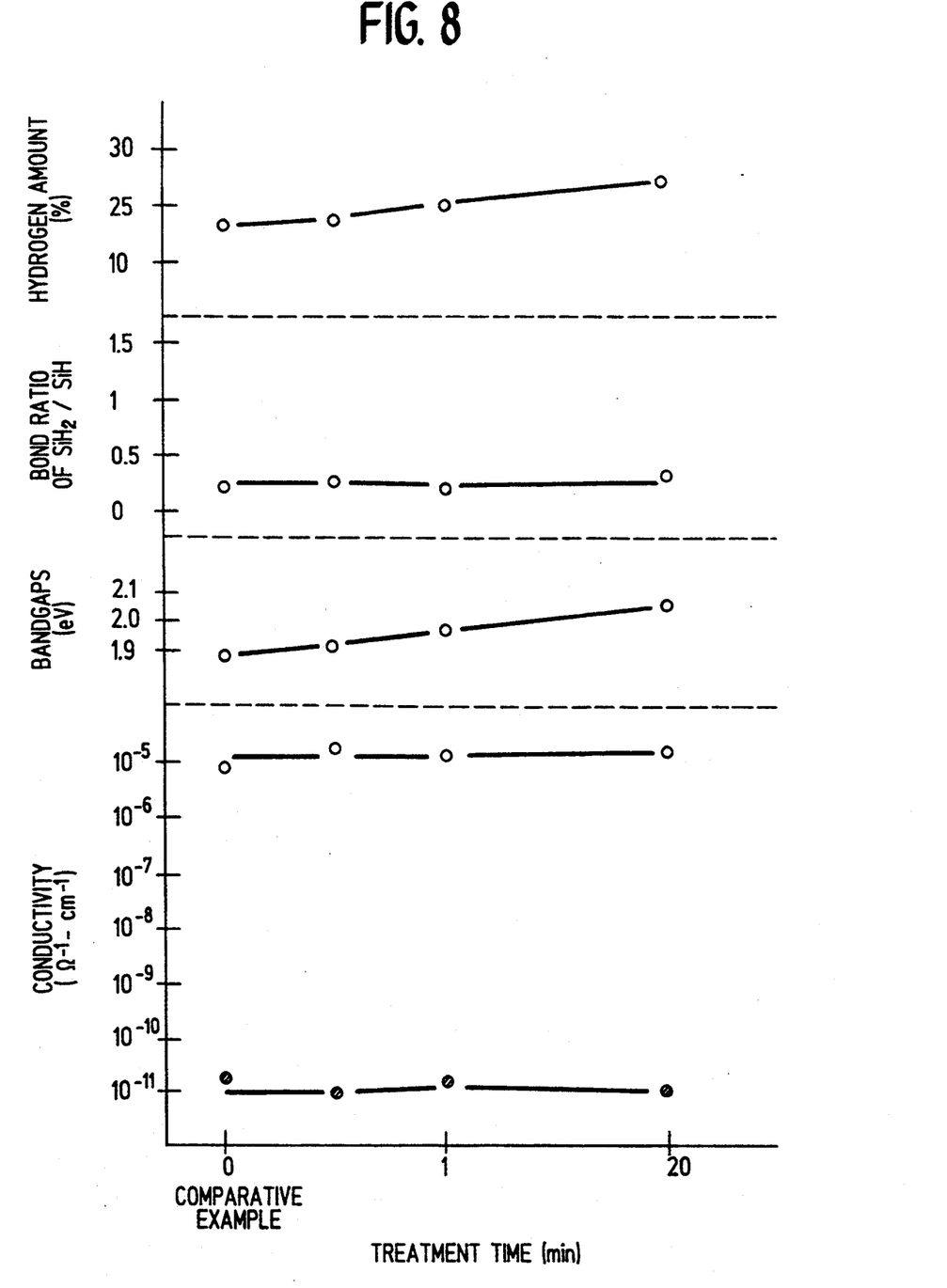
FIG. 8 is a graph showing the relationship between plasma treatment time and characteristics of the a-SiC layer using hydrogen in accordance with the third embodiment, as shown in FIG. 4.

The typical characteristics of the a-SiC layer 32 are shown in FIG. 8. These characteristics change in accordance with the duration of the plasma treatment. In FIG. 8, 20 samples were formed with an a-SiC layer of approximately 50 Å, and were plasma treated using hydrogen gas. The conditions for generation of the plasma in the plasma treatment are as follows: the gas pressure is set at 0.2 torr, the RF power is set at 16 W, the flow rate of hydrogen gas is set at 200 sccm and the substrate temperature is set at 180° C. Also, in FIG. 8, the results obtained from a layer formed without the plasma treatment (i.e. treatment time=0) are shown. According to FIG. 8, as the duration of the plasma treatment is made longer, the optical bandgap is increased from about 1.9 (eV) without treatment to about 2.1 (eV) with the treatment of the present invention. The percentage of hydrogen in the layer also increases in proportion to the duration of the plasma treatment using hydrogen gas.

However, the bond ratio of $SiH_2/SiH$ does not change regardless of the duration of the plasma treatment. This result means that the a-SiC layer 32 formed by the method of the present invention has high photo-conductivity and a large optical bandgap without layer quality deterioration.

Figure 9:
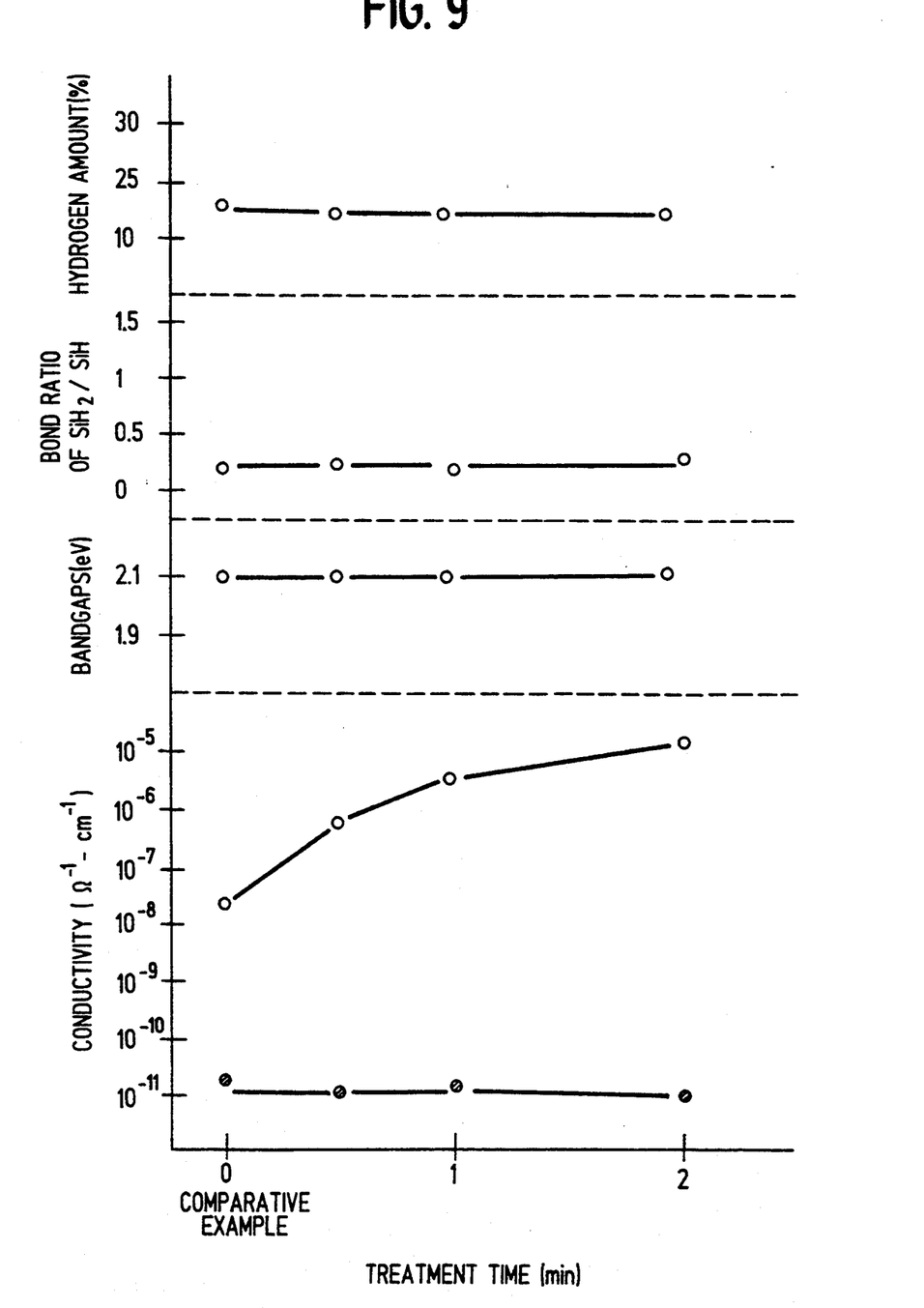
FIG. 9 is a graph showing the relationship between treatment time and characteristics of the a-SiC layer using Argon gas in accordance with the third embodiment of the present invention shown in FIG. 4.

FIG. 9 shows the typical characteristics of a-SiC layer 32 which change in accordance with the duration of the plasma treatment. In FIG. 9, 20 samples were formed with an a-SiC layer of approximately 50 Å, and were plasma treated using an inert gas, i.e. Argon (Ar) gas. The conditions for generation of the plasma in the plasma treatment are as follows: the gas pressure is set at 0.05 torr, the RF power is set at 16 W, the flow rate of argon (Ar) gas is set at 50 sccm and the substrate temperature is set to a value of 80° C. Also, in FIG. 9, the results obtained from a layer formed without the plasma treatment (i.e. treatment time=0) are shown. According to FIG. 9, as the duration of the plasma treatment is made longer, the photo-conductivity of the present invention is sharply increased. However, the amount of the hydrogen in the layer and the size of the optical bandgap in the layer does not show the same increase in quality. On the other hand, dark conductivity (not shown) is not influenced by the duration of the plasma treatment. Therefore, the difference between the photo-conductivity of the device during light irradiation and in the dark can be increased.

Figure 10:
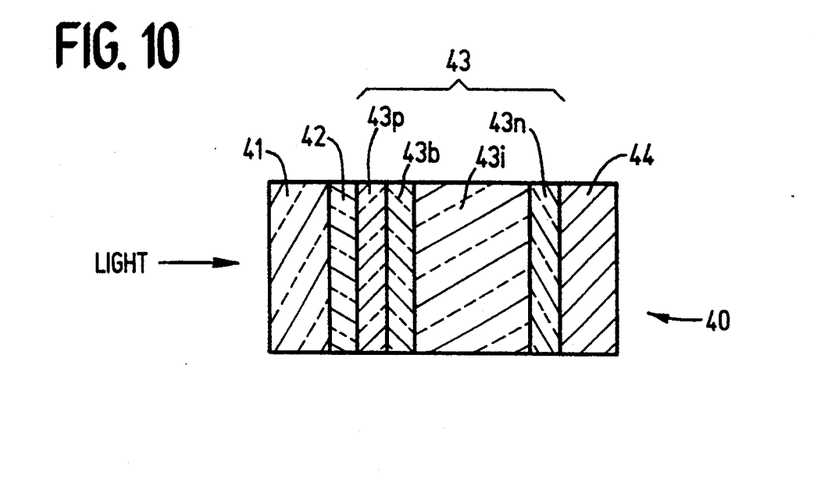
FIG. 10 is a side elevation cross-sectional view of a photovoltaic device in accordance with the third embodiment of the present invention shown in FIG. 4.

In the following example, a photovoltaic device having an aSiC layer 43 composed of a plurality of films is prepared in accordance with the above embodiment and is described below with reference to FIG. 10. FIG. 10 is a cross-sectional view of a photovoltaic device 40 having a transparent insulating substrate 41 composed of plate glass, silica glass or the like, a transparent conductive electrode layer 42 composed of ITO or the like, and a photovoltaic layer 43 mainly composed a-SiC. The photovoltaic layer 43 is comprised of a p-type amorphous semiconductor layer 43p composed of p-type a-SiC, a buffer layer 43b composed of aSiC, an intrinsic amorphous semiconductor 43i composed of intrinsic a-SiC, and an n-type amorphous semiconductor layer 43n composed of a-SiC. The four layers 43p, 43b, 43i, and 43n are formed and stacked in the order shown to obtain the photovoltaic layer 43. The photovoltaic device 40 is completed with a back electrode 44 composed of aluminum (Al), silver (Ag) plate, or the like, attached to the n-type layer 43n of the photovoltaic layer 43. The typical conditions for forming the photovoltaic layers 43, except for the a-SiC layer 43b, are shown in table 6.

TABLE 6

| Typical conditions | P-layer | i-layer | n-layer |
|---|---|---|---|
| SiH4 (sccm) | 10 | 50 | 10 |
| CH4 (sccm) | 10 | — | — |
| B2H6 (sccm) | 0.1 | — | — |
| PH3 (sccm) | — | — | 0.1 |
| H2 (sccm) | 10 | — | 10 |
| Substrate Temperature (°C.) | 200 | 200 | 200 |
| RF power (W) | 30 | 10 | 20 |
| Pressure (Pa) | 0.1 | 0.1 | 0.1 |

The buffer layer 43b of the a-SiC layer is formed in accordance with the method described above for the a-SiC layer which is composed of a plurality of films. The thickness of the buffer layer 43 is approximately 100 Å.

The electrical characteristics of the photovoltaic device of the above described third embodiment are compared to a prior art cell in table 7.

TABLE 7

|  | Present invention | Prior art |
|---|---|---|
| Open-circuit voltage Voc (v) | 0.90 | 0.89 |
| Short-circuit current Isc (mA/cm2) | 17.2 | 17.0 |
| Fill factor FF | 0.72 | 0.70 |
| Conversion efficiency (%) | 11.1 | 10.6 |

In table 7, the prior art photovoltaic device is constructed with an a-SiC layer having a thickness of approximately 100 Å with no plasma treatment being performed. The a-SiC layer is prepared by a continuous plasma-CVD forming process to achieve the 100 Å thickness.

According to table 7, the photovoltaic device of the present invention, compared to the prior art device, has excellent characteristics; the open-circuit voltage increases from a value of 0.89 V up to 0.90 V, the short-circuit current increases from a value of 17.0 mA/cm$^2$ up to 17.2 mA/cm$^2$ and the fill factor also improves from a rate of 0.70 up to 0.72, respectively. As a result of this, the conversion efficiency, which is a calculated evaluation of the photovoltaic devices, is improved from 10.6% to 11.1%.

This improvement of the characteristics for the photovoltaic device results from the a-SiC layer being composed of multiple aSiC films formed by the manufacturing method of the present invention. This causes an improvement of the interface quality between the p-type amorphous semiconductor layer 43p and the intrinsic amorphous semiconductor layer 43i. Moreover, the loss of incident light may also be reduced.

FOURTH EMBODIMENT

Figure 11:
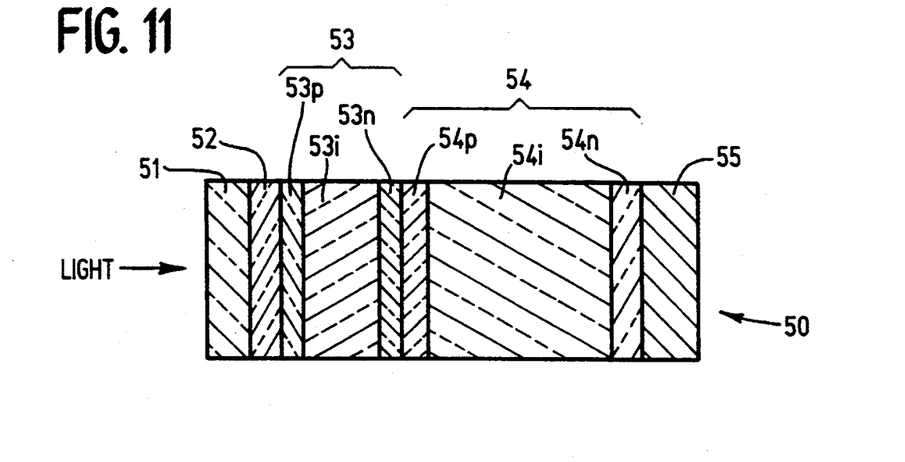
FIG. 11 is a side elevation cross-sectional view of a photovoltaic device in accordance with a fourth embodiment of the present invention.

As a fourth embodiment of the present invention, FIG. 11 shows a cross-sectional view of a photovoltaic device 50 having two stacked photovoltaic layers. In FIG. 11, the photovoltaic device 50 is comprised of a transparent insulating substrate 51 comprised of plate glass, silica glass or the like, a transparent conductive electrode layer 52 composed of ITO, and a first photovoltaic layer 3 mainly composed of an a-SiC layer. The first photovoltaic layer 53 comprises a p-type amorphous semiconductor layer 53p composed of p-type a-SiC, an intrinsic amorphous semiconductor 53i composed of intrinsic a-SiC, and an n-type amorphous semiconductor layer 53n composed of a-SiC, The three layers 53p, 53i, and 53n are formed and stacked in the order shown to obtain the first photovoltaic layer 53. The photovoltaic device 50 also has a second photovoltaic layer 54 which is prepared in the same manner as the first photovoltaic layer 53. The second photovoltaic layer 54 is comprised of a p-type amorphous semiconductor layer 54p composed of p-type a-SiC, an intrinsic amorphous semiconductor 54i composed of intrinsic a-SiC, and an n-type amorphous semiconductor layer 54n composed of a-SiC. The three layers 54p, 54i, and 54n are formed and stacked in the order shown to obtain the second photovoltaic layer 54. Thus, the first photovoltaic layer 53 is formed between the transparent electrode layer 52 and the second photovoltaic layer 54. The first and second photovoltaic layers 53 and 54 are connected by the p-type a-SiC layer 54p formed on the n-type a-SiC layer 53n. The photovoltaic device 50 is completed with a back electrode 55 composed of aluminum (Al), silver (Ag) plate or the like, attached to the n-type layer 54n of the second photovoltaic layer 54. The typical conditions for forming the photovoltaic layers 53 and 54, except for the a-SiC layer 53i, are shown in table 8.

TABLE 8

| Typical conditions | 53 p, 54 p | 54 i | 53 n, 54 n |
|---|---|---|---|
| SiH4 (sccm) | 10 | 50 | 10 |
| CH4 (sccm) | 10 | — | — |
| B2H6 (sccm) | 0.1 | — | — |
| PH3 (sccm) | — | — | 0.1 |
| H2 (sccm) | 10 | — | 10 |
| Substrate Temperature (°C.) | 200 | 250 | 200 |
| RF power (W) | 30 | 10 | 20 |
| Pressure (Torr) | 0.1 | 0.1 | 0.1 |

In the above described photovoltaic device, the intrinsic amorphous semiconductor layer 53i is formed by the same method used to form the a-SiC layer in the third embodiment. The thickness of the intrinsic amorphous semiconductor layer 53i is set to approximately 1000 Å. The formation of a-SiC films and the corresponding plasma treatment of the films are carried out, repeatedly, for example, 20 times. This is required in order to obtain a sufficient thickness of the intrinsic amorphous semiconductor layer.

The electrical characteristics of the above described photovoltaic device 50 of the fourth embodiment are compared to a prior art device in table 9.

TABLE 9

|  | Example | Reference (Prior Art) |
|---|---|---|
| Open-circuit voltage Voc (v) | 1.90 | 1.85 |
| Short-circuit current Isc (mA/cm$^2$) | 8.5 | 8.0 |
| Fill factor FF | 0.72 | 0.71 |
| Conversion efficiency (%) | 11.6 | 10.5 |

In table 9, the prior art photovoltaic device is constructed with an a-SiC layer that does not undergo the plasma treatment of the present invention. The layer of a-SiC is prepared by a continuous plasma-CVD forming process to achieve the same thickness (without forming a plurality of stacked films of a-SiC) as the intrinsic layer 53i sandwiched between the p-type layer 53p and the n-type layer 53n in the first photovoltaic layer 53.

According to table 9, the photovoltaic device 50 of the present invention, compared to the prior art device, has excellent characteristics; the open-circuit voltage increases from 1.85 V up to 1.90 V and the short-circuit current increases from 8.0 mA/cm$^2$ up to 8.5 mA/cm$^2$. As a result of this, the conversion efficiency, which is a calculated evaluation of the photovoltaic devices, is improved from 10.5% to 11.6%.

This improvement of the characteristics for the photovoltaic device results from a large optical bandgap in the a-SiC layer (indeed the first photovoltaic layer 53) composed of multiple aSiC films formed by the manufacturing method of the present invention. This photovoltaic device also has an increased transmission of light through the first photovoltaic layer 53 to the second photovoltaic layer 54. Moreover, the interface quality of the photovoltaic layer 53 is improved, and therefore, the electrical characteristics of the photovoltaic device is advanced.

In the fourth embodiment of the present invention, the plasma treatment uses hydrogen gas to obtain the a-SiC layer. However, the plasma treatment could use an inert gas, such as Argon (Ar), Helium (He), Neon (Ne), Krypton (Kr), or Xenon (Xe) to obtain the same results and advantages, as described above.

In the third and fourth embodiments of the present invention, a structure using a transparent substrate wherein the incident light passes through the substrate is described. However, by using an opaque (non-transparent) substrate, and successively forming a back electrode composed of a metal, a-SiC semiconductor layers, a transparent conductive electrode layer, and a front electrode, the advantages of the present invention can be achieved. The photovoltaic device of this structure uses light passing through the front electrode.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. In a photovoltaic device having a transparent substrate, a plurality of photovoltaic layers provided on said transparent substrate, and a back electrode disposed on said plurality of photovoltaic layers, the improvement wherein:

one of said plurality of photovoltaic layers is composed of a first conductivity type amorphous semiconductor layer in contact with said transparent substrate, a photosensitive layer provided on said first conductivity type amorphous semiconductor layer, and a second conductivity type amorphous semiconductor layer provided on said photosensitive layer, wherein said photosensitive layer is composed of an intrinsic amorphous SiC layer having a thickness less than about 1000 Å, said intrinsic amorphous SiC layer first being formed by a plasma-CVD process on said first conductivity type amorphous semiconductor layer and then treated by a plasma treatment, said plasma-CVD process and said plasma treatment being repeated multiple times providing a thickness of less than about 100 Å each time in order to achieve said layer thickness of less than about 1000 Å, and wherein said plasma treatment uses hydrogen ($H_2$) gas and said hydrogen gas is contained in said photosensitive layer in an amount of greater than 20 atom %.

2. A method as described in claim 1 wherein said hydrogen gas is contained in an amount of less than 30 atom %.

3. In a photovoltaic device having an opaque substrate, a plurality of photovoltaic layers provided on said opaque substrate, and a transparent electrode disposed on said plurality of photovoltaic layers, the improvement wherein:

one of said plurality of photovoltaic layers is composed of a first conductivity type amorphous semiconductor layer in contact with said transparent electrode, a photosensitive layer provided on said first conductivity type amorphous semiconductor layer, and a second conductivity type amorphous semiconductor layer provided on said photosensitive layer, wherein said photosensitive layer is composed of an intrinsic amorphous SiC layer having a thickness less than about 1000 Å, said intrinsic amorphous SiC layer being first formed by a plasma-CVD process on said first conductivity type amorphous semiconductor layer and then treated by a plasma treatment, said plasma-CVD process and said plasma treatment being repeated multiple times providing a thickness of less than about 100 Å each time in order to achieve said layer thickness of less than about 1000 Å, and wherein said plasma treatment uses hydrogen ($H_2$) gas and said hydrogen gas is contained in said photosensitive layer in an amount of greater than 20 atom %.

4. A method as described in claim 3 wherein said hydrogen gas is contained in an amount of less than 30 atom %.

5. A method for manufacturing a photovoltaic device, comprising the steps of:

providing a transparent substrate;

depositing a transparent conductive layer on said transparent substrate;

forming a first conductivity type amorphous semiconductor on said transparent conductive layer;

forming a photosensitive layer on said first conductivity type amorphous semiconductor layer, wherein said photosensitive layer is composed of an intrinsic amorphous SiC formed by a plasma-CVD process and having a final thickness less than 1000 Å;

treating said photosensitive layer by a plasma treatment, wherein said plasma-CVD process and said plasma treatment is repeated multiple times providing a thickness of less than about 100 Å each time in order to achieve said layer thickness of less than about 1000 Å wherein said plasma treatment uses hydrogen ($H_2$) gas and said hydrogen gas is contained in said photosensitive layer in an amount of greater than 20 atom %;

forming a second conductivity type amorphous semiconductor layer on said photosensitive layer;

forming at least one photovoltaic layer on said second conductivity type amorphous semiconductor layer; and providing a back electrode on said at least one photovoltaic layer.

6. A method as described in claim 5 wherein said hydrogen gas is contained in an amount of less than 30 atom %.

7. A method for manufacturing a photovoltaic device, comprising the steps of:

providing an opaque substrate;

forming at least one photovoltaic layer on said opaque substrate;

forming a first conductivity type amorphous semiconductor layer on said at least one photovoltaic layer;

forming a photosensitive layer on said first conductivity type amorphous semiconductor layer, wherein said photosensitive layer is composed of intrinsic amorphous SiC formed by a plasma-CVD process and having a final thickness less than about 1000 Å;

treating said photosensitive layer by a plasma treatment, wherein said plasma-CVD process and said plasma treatment is repeated multiple times providing a thickness of less than about 100 Å each time in order to achieve said layer thickness of less than about 1000 Å wherein said plasma treatment uses hydrogen (H$_2$) gas and said hydrogen gas is contained in said photosensitive layer in an amount of greater than 20 atom;

forming a second conductivity type amorphous semiconductor layer on said photosensitive layer; and providing a transparent conductive electrode on said second conductivity type amorphous semiconductor layers.

8. A method as described in claim 7 wherein said hydrogen gas is contained in an amount of less than 30 atom %.

* * * * *